United States Patent
He et al.

(10) Patent No.: US 8,928,125 B2
(45) Date of Patent: *Jan. 6, 2015

(54) INTERCONNECTS HAVING SEALING STRUCTURES TO ENABLE SELECTIVE METAL CAPPING LAYERS

(75) Inventors: Jun He, Portland, OR (US); Kevin J. Fischer, Hillsboro, OR (US); Ying Zhou, Tigard, OR (US); Peter K. Moon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 453 days.

This patent is subject to a terminal disclaimer.

(21) Appl. No.: 13/242,988

(22) Filed: Sep. 23, 2011

(65) Prior Publication Data
US 2012/0007242 A1    Jan. 12, 2012

Related U.S. Application Data

(62) Division of application No. 12/079,683, filed on Mar. 28, 2008, now Pat. No. 8,058,710, and a division of application No. 11/144,576, filed on Jun. 3, 2005, now Pat. No. 7,402,519.

(51) Int. Cl.
*H01L 23/48* (2006.01)

(52) U.S. Cl.
USPC ....... 257/632; 257/762; 257/774; 257/E23.01

(58) Field of Classification Search
USPC ............... 257/632, 762–768, 774, E23.01
See application file for complete search history.

(56) References Cited

U.S. PATENT DOCUMENTS

| | | | |
|---|---|---|---|
| 6,077,774 A | 6/2000 | Hong et al. | |
| 6,358,832 B1 | 3/2002 | Edelstein et al. | |
| 6,597,068 B2 | 7/2003 | Petrarca et al. | |
| 6,833,321 B2 * | 12/2004 | Hau-Riege et al. | 438/659 |
| 7,087,524 B2 * | 8/2006 | Park | 438/672 |
| 8,058,710 B2 * | 11/2011 | He et al. | 257/632 |
| 2002/0042193 A1 | 4/2002 | Noguchi et al. | |
| 2006/0220197 A1 | 10/2006 | Kobrinsky et al. | |

* cited by examiner

*Primary Examiner* — Thanh Nguyen
(74) *Attorney, Agent, or Firm* — Blakely, Sokoloff, Taylor & Zafman LLP

(57) ABSTRACT

Methods of fabricating a capped interconnect for a microelectronic device which includes a sealing feature for any gaps between a capping layer and an interconnect and structures formed therefrom. The sealing features improve encapsulation of the interconnect, which substantially reduces or prevents electromigration and/or diffusion of conductive material from the capped interconnect.

18 Claims, 12 Drawing Sheets

INTERCONNECTS HAVING SEALING STRUCTURES TO ENABLE SELECTIVE METAL CAPPING LAYERS

This application is a divisional of U.S. application Ser. No. 12/079,683, filed on Mar. 28, 2008, which is presently pending, which is a divisional of U.S. Pat. No. 7,402,519, issued on Jul. 22, 2008.

FIELD OF THE DISCLOSURE

An embodiment of the present invention relates to microelectronic device fabrication. In particular, embodiments of the present invention relate to methods of fabricating interconnects with capping layers that include sealing structures to improved encapsulation of the interconnects.

BACKGROUND

The microelectronic device industry continues to see tremendous advances in technologies that permit increased integrated circuit density and complexity, and equally dramatic decreases in package size. Present semiconductor technology now permits single-chip microprocessors with many millions of transistors, operating at speeds of tens (or even hundreds) of MIPS (millions of instructions per second), to be packaged in relatively small, air-cooled microelectronic device packages. These transistors are generally connected to one another and/or to devices external to the microelectronic device by conductive traces and vias (hereinafter collectively referred to "interconnects") through which electronic signals are sent and/or received.

One process used to form interconnects is known as a "damascene process". In a typical damascene process, as shown in FIG. 17, a photoresist material 202 is patterned on a first dielectric material layer 204, which is etched through the photoresist material 202 patterning to form a hole or trench 206 extending to at least partially through the first dielectric material layer 204, as shown in FIG. 18. The photoresist material 202 is then removed (typically by an oxygen plasma) and a barrier layer 208 is deposited within the hole or trench 206 on sidewalls 210 and a bottom surface 212 thereof to prevent conductive material (particularly copper and copper-containing alloys), which will be subsequently deposited into the hole or trench 206, from migrating into the first dielectric material layer 204, as shown in FIG. 19. The migration of the conductive material can adversely affect the quality of microelectronic device, such as leakage current and reliability between the interconnects, as will be understood to those skilled in the art. The barrier layer 208 used for copper-containing conductive materials are usually nitrogen-containing materials, including, but not limited to tantalum, tantalum nitride, titanium, titanium nitride, and ruthenium. The deposition of the barrier layer 208 usually results in a portion of the barrier layer 208 extending on a first surface 214 of the first dielectric material layer 204.

As shown in FIG. 20, a seed material 216 may be deposited on the barrier layer 208. The hole or trench 206 is then filled, usually by an electroplating process, with the conductive material (e.g., such as copper and alloys thereof), as shown in FIG. 21, to form a conductive material layer 218. Like the barrier layer 208, excess conductive material may form proximate the first dielectric material layer first surface 214. The resulting structure is planarized, usually by a technique called chemical mechanical polish (CMP), which removes the portion conductive material layer 218 and barrier layer 208 that is not within the hole or trench 206 (see FIG. 19) from the surface first dielectric material first surface 214, to form the interconnect 222, as shown in FIG. 22.

As shown in FIGS. 23 and 24, the interconnect 222 is then capped with a capping layer 224 including, but not limited to, cobalt and alloys thereof. The capping layer 224 may be formed by any method known in the art, including plating techniques. The capping layer 224 prevents the electromigration and/or diffusion of the conductive material of the interconnect 222 into a subsequently deposited second dielectric material layer (not shown), which is deposited over the first dielectric material layer 204 and capping layer 224.

A selective deposition process, such as electroless plating, is a standard industry approach for forming the capping layer 224 due to its process simplicity. However, one of the challenges of selective processes is their sensitivity to surface contamination, oxidation, and/or poor deposition (particularly with copper interconnects), which results in process marginality. Furthermore, current interconnect structures may not provide sufficient encapsulation of the conductive material of the interconnects. For example, referring to back to FIGS. 23 and 24, the area of confluence 230 of the capping layer 224 and the barrier layer 208 (shown within the dashed circle) can provide insufficient coverage to prevent the conductive material of the interconnect 222 from electromigrating and/or diffusing into surrounding dielectric and devices through the gap between the capping layer 224 and the barrier layer 208.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION

Figure 1:
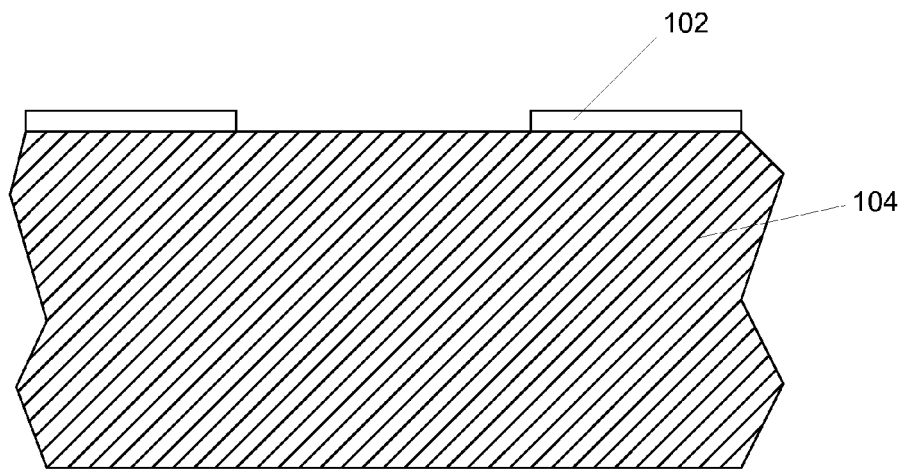
FIGS. 1-8 illustrate a side cross-sectional views of an embodiment of a method of fabricating a capped interconnect having a sealing layer structure, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

An embodiment of the present invention relates to the fabrication of a capped interconnect for a microelectronic device which includes a sealing feature for any gaps between a capping layer and an interconnect. The sealing feature improves encapsulation of the interconnect to substantially reduce or prevent electromigration and/or diffusion of conductive material from the capped interconnect.

Figure 2:
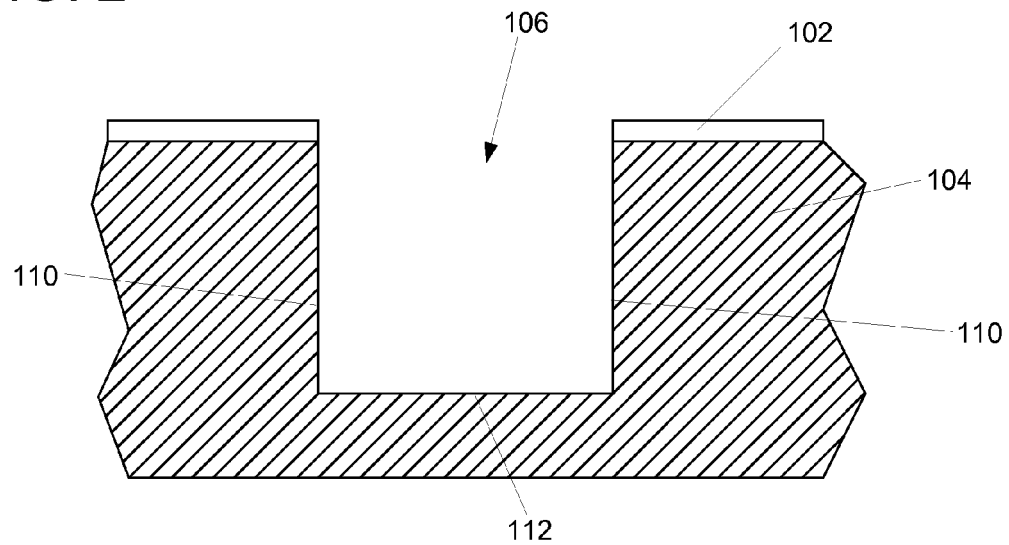
Figure 3:
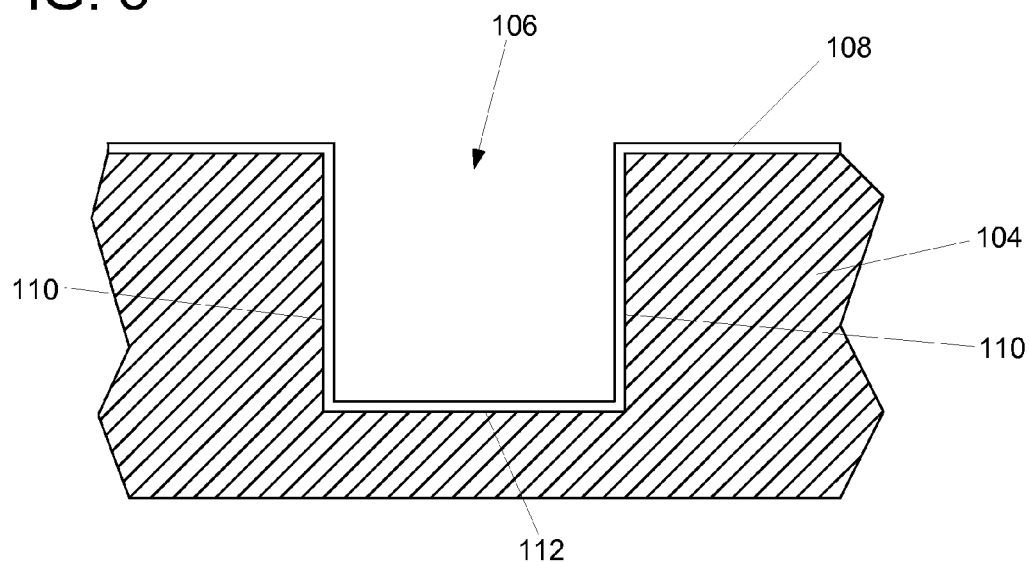

One embodiment of a process used to form a capped interconnect, according to the present invention, comprises patterning a photoresist material 102, as known in the art, on a dielectric material layer 104, as shown in FIG. 1. The dielectric material layer 104 may include, but is not limited to, silicon dioxide, silicon nitride, carbon doped oxide, fluorine doped oxide, porous dielectrics, and the like. The dielectric material layer 104 is etched through the photoresist material 102 patterning to form a hole or trench 106 (hereinafter referred to collectively as "opening 106") extending to at least partially through the dielectric material layer 104, as shown in FIG. 2. The photoresist material 102 is then removed (typically by an oxygen plasma) and a barrier layer 108 may be deposited within the opening 106 on sidewalls 110 and a bottom surface 112 thereof to prevent conductive material (particularly copper and copper-containing alloys), which will be subsequently deposited into the opening 106 from migrating into the dielectric material layer 104, as shown in FIG. 3. The barrier layer 108 used for copper-containing conductive materials is usually a nitrogen-containing material, including, but not limited to titanium, titanium nitride, tantalum, tantalum nitride, and ruthenium. A portion of the barrier layer 108 may also extend over and abut a first surface 114 of the dielectric material layer 104. It is, of course, understood that the opening 106 can be formed by any known technique beyond the lithography technique discussed above, including, but not limited to, ion milling and laser ablation.

Figure 4:
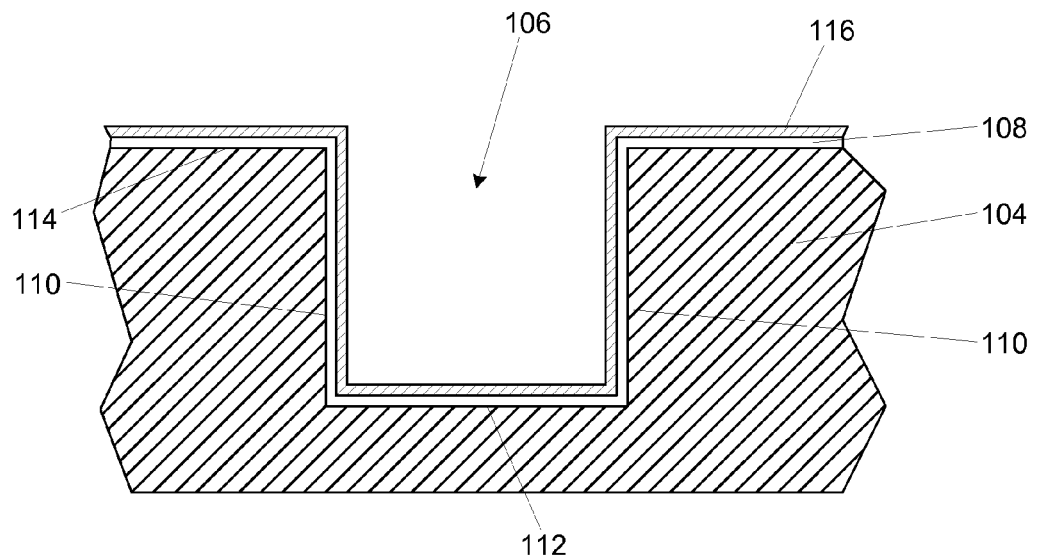
Figure 5:
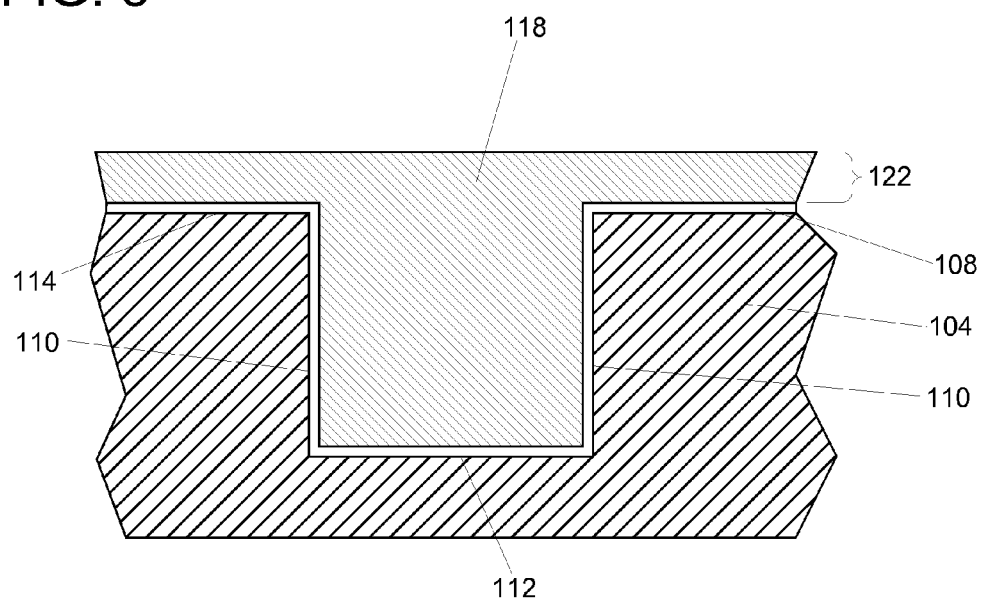

As shown in FIG. 4, a seed material 116 may be deposited on the barrier layer 108 by any method known in the art. The seed material 116 may include copper, ruthenium, and the like. It is, of course, understood that the seed material 116 may not be necessary if the barrier layer 108 can act as a seed material, such as ruthenium. The opening 106 is then filled with the conductive material, such as copper, aluminum, alloys thereof, and the like, as shown in FIG. 5, to form a conductive material layer 118. The conductive material layer 118 may be formed by any known process, including but not limited to electroplating, deposition, and the like.

Figure 6:
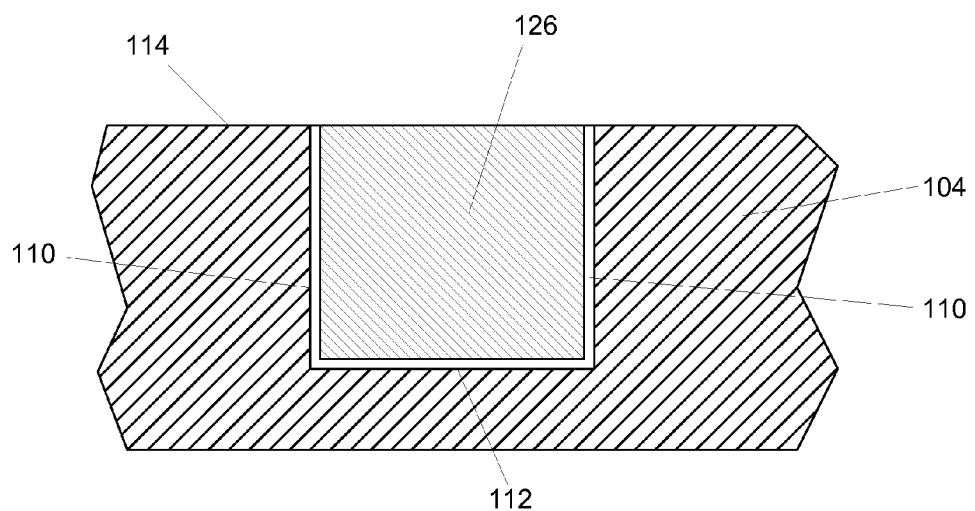

As previously discussed with regard to the barrier layer 108, excess conductive material layer 122 (e.g., any conductive material not within the opening 106) of the conductive material layer 118 may form proximate the dielectric material layer first surface 114 (see FIG. 5). The resulting structure is planarized, usually by a technique called chemical mechanical polish (CMP), which removes the excess conductive material layer 122 and the portion of the barrier layer 108 that is not within the opening 106 (see FIG. 4) from the dielectric material layer first surface 114, to form an interconnect 126 comprising the remaining conductive material and the barrier layer (if present), as shown in FIG. 6.

Figure 7:
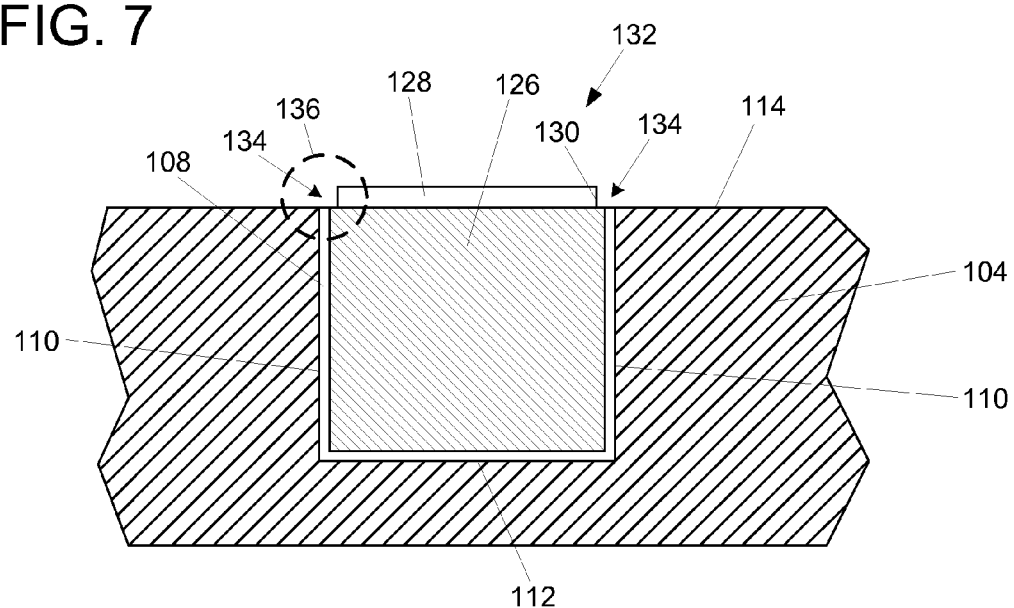

As shown in FIG. 7, the interconnect 126 is then capped with a capping layer 128 including, but not limited to, refractory metals, such as cobalt and alloys thereof. Thus, a capped interconnect 132, comprising the barrier layer 108, the interconnect 126, and the capping layer 128, is formed. The capping layer 128 may be formed by any method known in the art, including plating and lithographic techniques. However, as previously discussed, opening, gaps or pinholes 134 (hereinafter "gaps") may form in corners 136 between the capping layer 128 and the interconnect 126. In order to prevent out-diffusion and/or electromigration of the conductive material of the interconnect 126, a sealing structure is used to cap the gaps 134.

Figure 8:
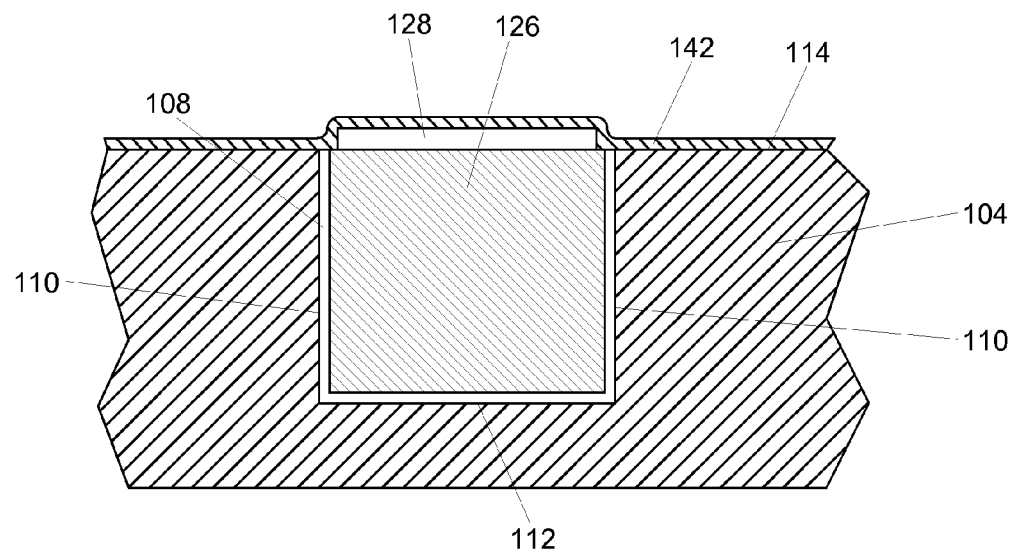

In one embodiment, as shown in FIG. 8, a sealing layer 142 is deposited over the capping layer 128, the gaps 134, any exposed portions of the barrier layer 108, and dielectric material layer first surface 114. The sealing layer 142 may be made of any appropriate material, including, but not limited to, silicon nitride and nitrogen-doped carbide deposited by any know method, including but not limited to, low pressure physical vapor deposition at about 400 degrees Celsius.

Figure 9:
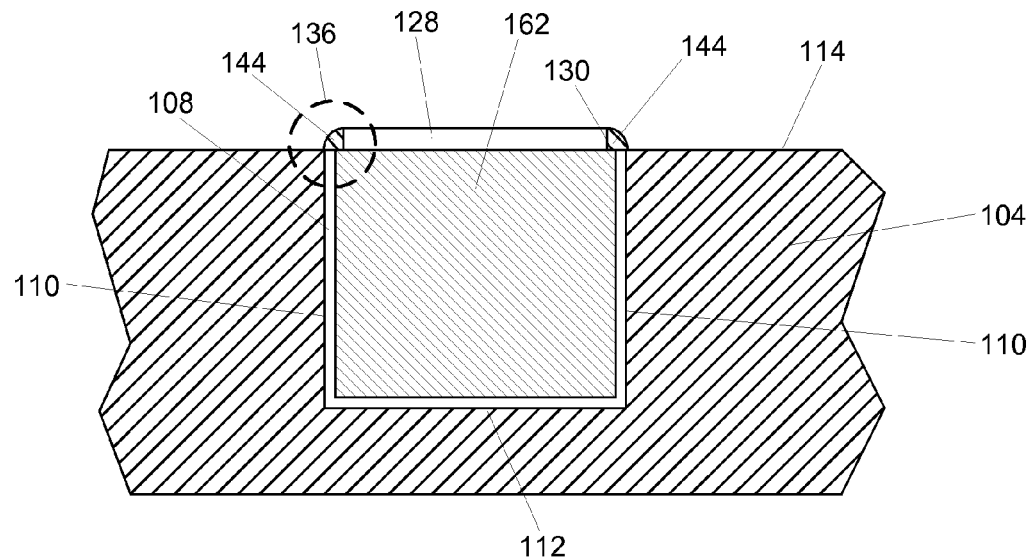
FIG. 9 illustrates a side cross-sectional view of an embodiment of a method of fabricating a capped interconnect having sealing spacers, according to the present invention.

The sealing layer 142 embodiment shown in FIG. 8 may cause some high capacitance impacts due to its non-selective nature, as will be understood to those skilled in the art. Thus, in yet another embodiment, a portion of the sealing layer 142 may be removed to leave sealing spacers 144 in the corners 136 abutting an edge 130 (substantially perpendicular to the dielectric material first surface 114) of the capping layer 128 and the barrier layer 108 and/or the dielectric material layer first surface 114, as shown in FIG. 9. The formation of the sealing spacers 144 can be achieved by timed, dry anisotropic etching of the sealing layer 142 (shown in FIG. 8), which removes a portion of the sealing layer 142 from the dielectric material layer first surface 114 and the capping layer 128. However, due to the corner step between sealing layer 142 and the gaps 134, the sealing spacers 144 will form (similar to the formation of a MOS spacer). Any appropriate etched process may be used, such a dry etch process using $CO+O_2+CH_3F$ (ethyl fluoride).

Figure 10:
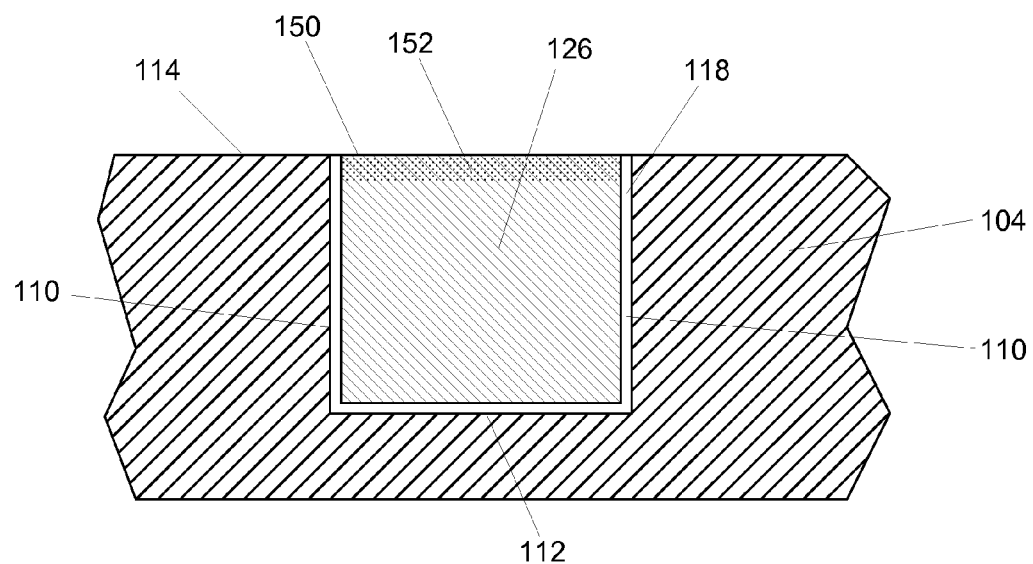
FIGS. 10-13 illustrate side cross-sectional views of a still another embodiment of a method of fabricating a capped interconnect having a metal oxide sealing structure, according to the present invention.

In yet another embodiment, from FIG. 6, a doped region 152 may be formed, such as by alloying seed, co-plating, or the like, in the interconnect 126 proximate a first surface 150 thereof, as shown in FIG. 10. The material used to dope/form the doped region 152 may be a readily oxidizable material, such as aluminum, tin, or the like, which can form very stable and hermetic oxide compounds. In one embodiment, the formation process is kept at a lower temperature and/or to a short process duration to avoid any surface segregation of the doped region 152 from the interconnect 126. As will be understood to those skilled in the art, exposure to oxygen rich environment should be substantially eliminated before forming the doped region 152, if surface segregation does occur.

Figure 11:
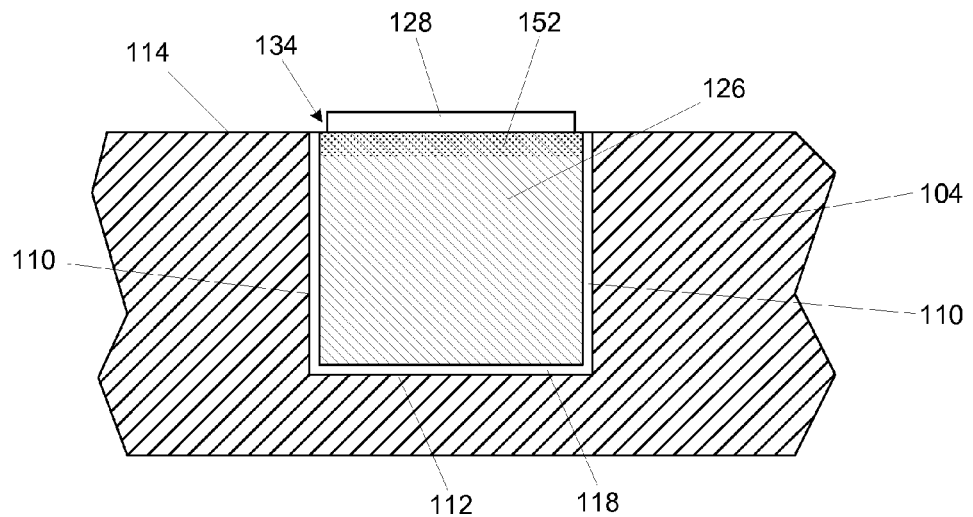
Figure 12:
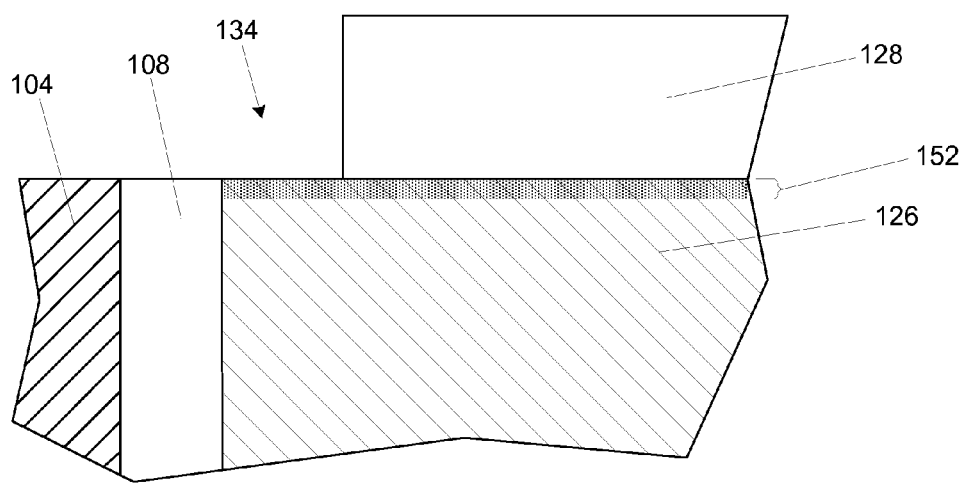
Figure 13:
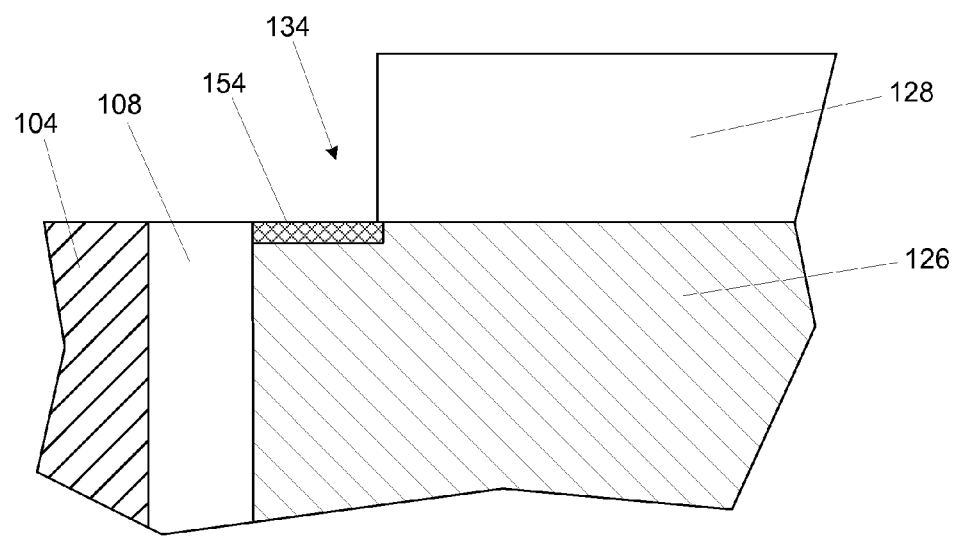

As shown in FIGS. 11 and 12, once the doped region 152 is formed in the interconnect 126, the capping layer 128 is formed, as discussed above. An anneal step, in either a forming gas or a nitrogen gas atmosphere, may be performed to promote diffusion of oxidizable metal of doped region 152 into the conductive material of the interconnect 126 where gaps 134 exist, as shown in FIG. 13. The doped region 152 is exposed to air or an oxygen gas rich environment, wherein the doping material in the doped region 152 can migrate to areas of such exposure, such that an oxide layer forms from the doped region 152 (such as aluminum oxide or tin oxide) to form a self-passivating oxide layer 154 (self-limiting oxidation process) on top of the gaps 134 or any other defects/pin holes exposing the interconnect 126. The self-passivating oxide layer 154 becomes a hermetic barrier for the conductive material of the interconnect 126. Forming the self-passivating oxide layer 154 after the formation of the capping layer 128 is desired to ensure minimum impact on the deposition of the capping layer 128 and alloying the conductive material of the interconnect 126, which will degrade the line resistance of the interconnect 126, as will be understood to those skilled in the art. With this process, there are no negative capacitance impacts, as there is no self-passivation oxide layer 154 formation on a dielectric material layer 104 between adjacent interconnects (not shown).

Figure 14:
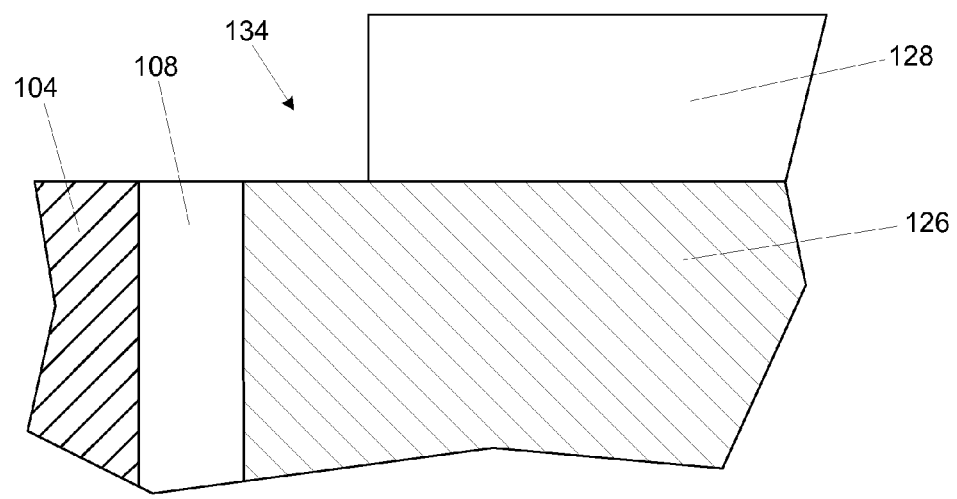
FIGS. 14-16 illustrate side cross-sectional views of yet another embodiment of a method of fabricating a capped interconnect having a silicon nitride sealing structure, according to the present invention.
Figure 15:
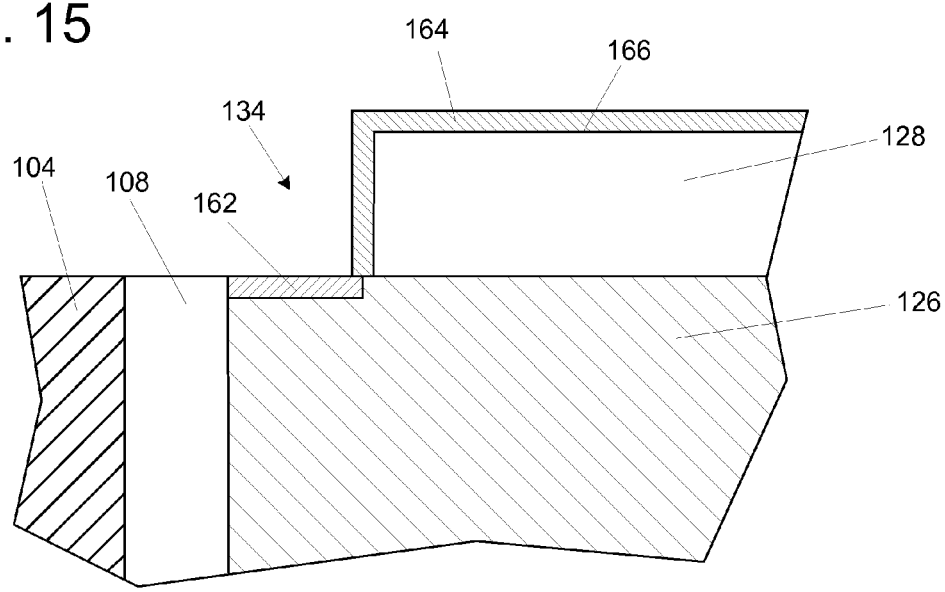
Figure 16:
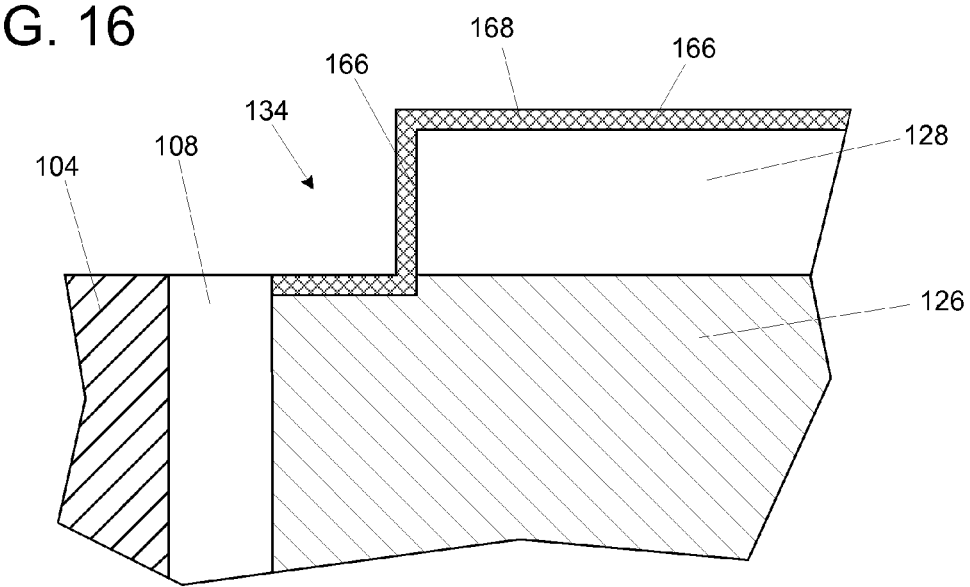
Figure 17:
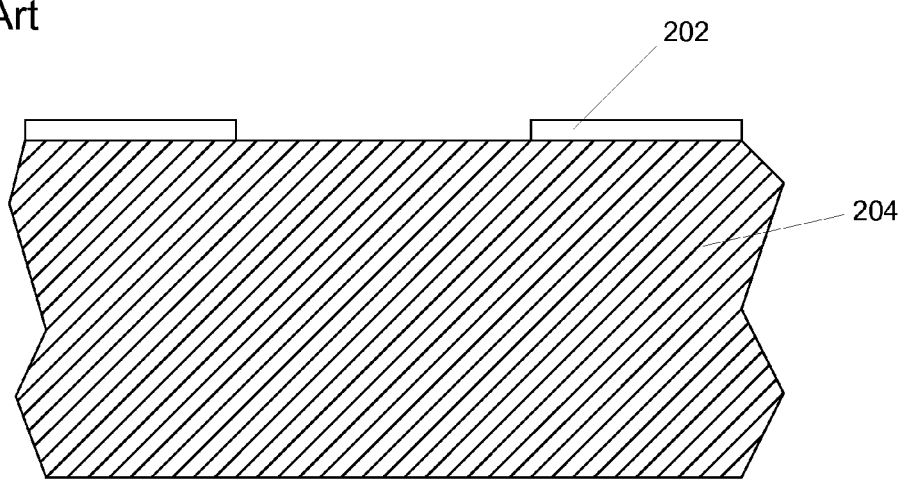
FIGS. 17-23 illustrate cross-sectional views of a method of fabricating a capped interconnect, as known in the art.
Figure 18:
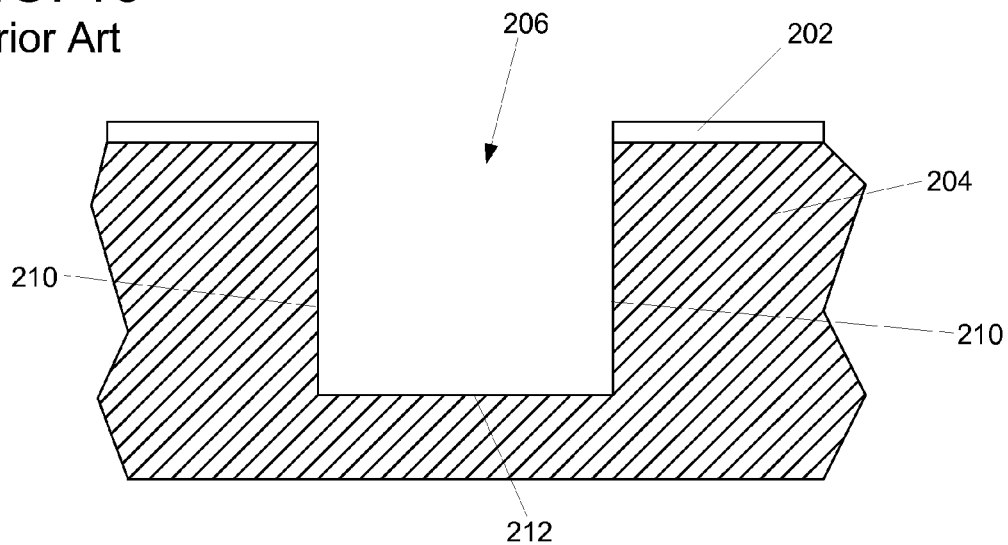
Figure 19:
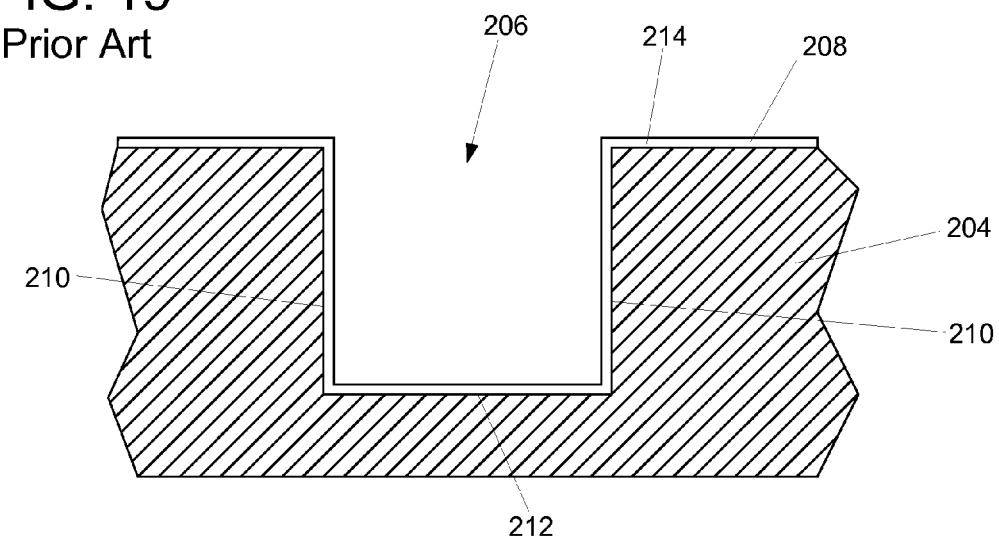
Figure 20:
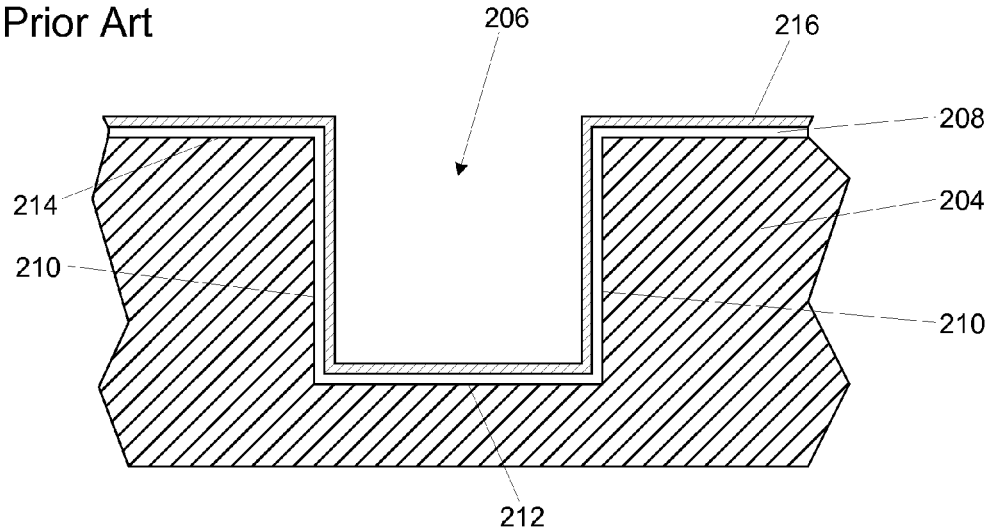
Figure 21:
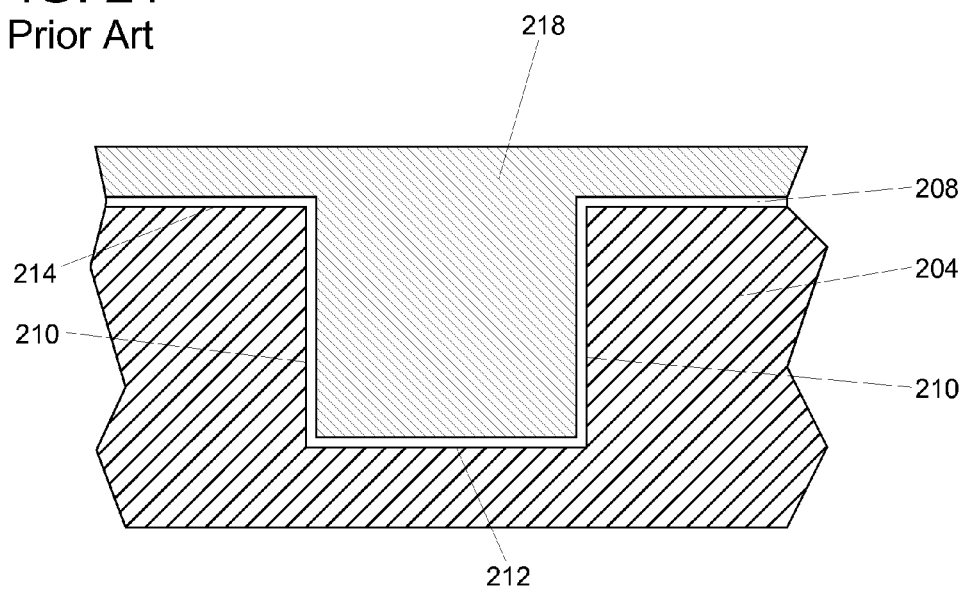
Figure 22:
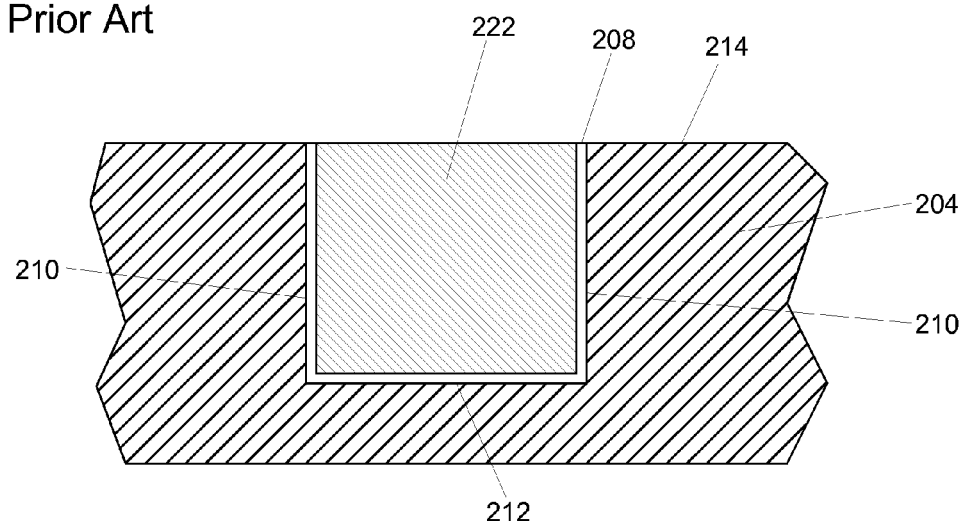
Figure 23:
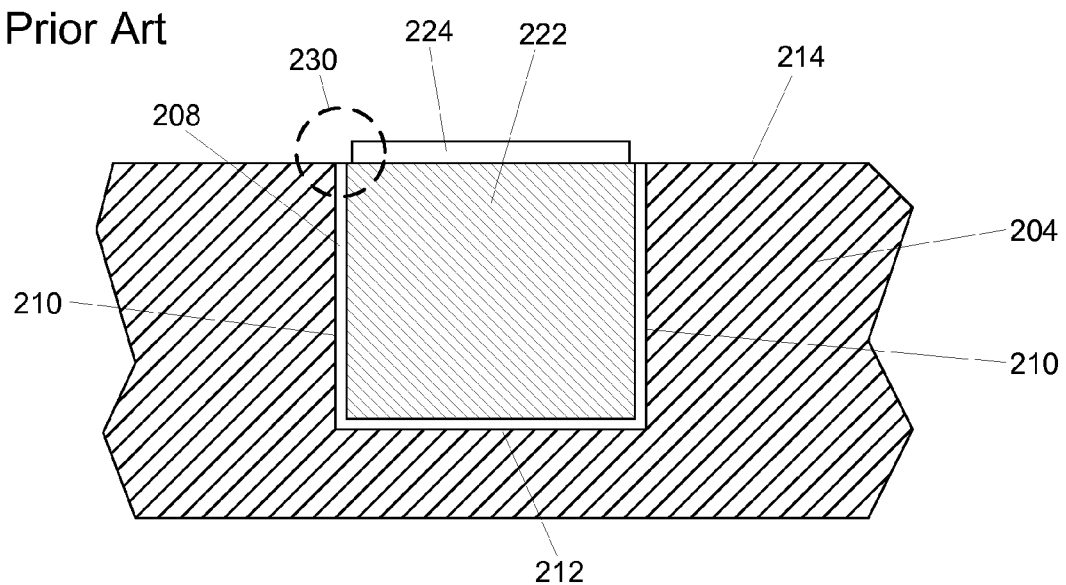
Figure 24:
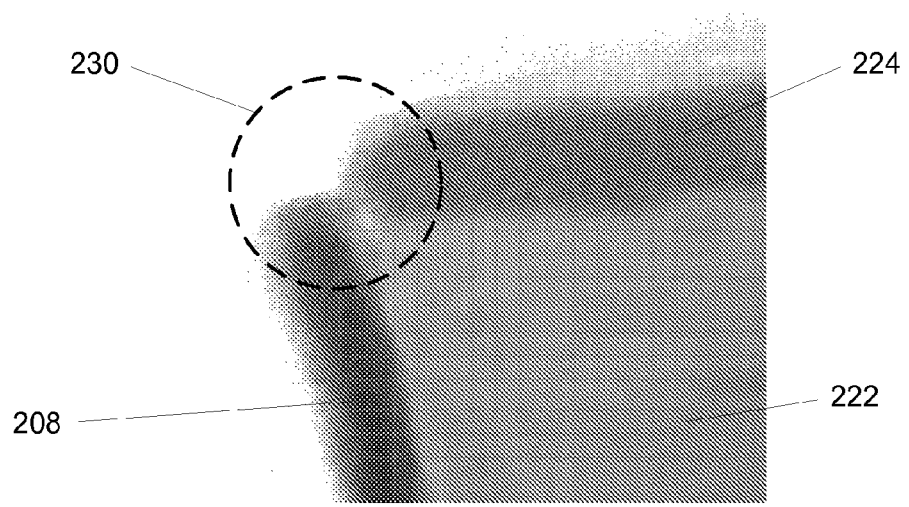
FIG. 24 illustrates a cross-sectional SEM of the confluence area shown in FIG. 23, as known in the art.

In still another embodiment, a silicon nitride layer is formed on the exposed conductive material of the interconnect 126 by a preferential chemical reaction. In one example, the structure of FIG. 14 is exposed to silane at a low temperature, preferably less than about 400 degrees Celsius to form a first salicide layer 162 from the exposed conductive material of the interconnect 126, as shown in FIG. 15. A second salicide layer 164 may also form from the exposed surface 166 of the capping layer 128. If the second salicide layer 164 forms it will do so at a different rate than the first salicide layer 162. However, this is not critical as long as the capping layer 128 is not fully consumed by the process. Additionally, there may be adverse consequences to line resistance due to the silicon incorporation into the interconnect 126 from the silane process. Therefore, the metal salicide layer should be formed at low temperatures, so that silicon diffusion into the interconnect will be minimized.

In one embodiment, the silane formation can proceed by the following reaction (unbalanced), wherein the interconnect 126 comprises copper:

$$SiH_4 + Cu \rightarrow CuSi_x + H_2 \uparrow + Si$$

The structure of FIG. 15 is then exposed to an ammonia source, such as an ammonia plasma, preferably at a temperature of less than about 400 degrees Celsius. The various techniques of striking and forming an ammonia plasma is well-known in the art. The exposure to an ammonia plasma converts at least a portion of the first salicide layer 162 and, if present, at least a portion of the second salicide layer 164 into a silicon nitride layer 168. Thus, the silicon nitride layer 168 is essentially formed from the conductive material, i.e., the depletion and conversion thereof. The preferential chemical reaction disclosed following the formation of the capping layer avoids the interaction with capping layer formation process with little capacitance impacts. However, the tradeoff is a slightly more complicated process sequence than the other embodiments disclosed.

In one embodiment, the silicon nitride layer formation can proceed by the following reactions (unbalanced), wherein the first salicide layer 162 comprises copper salicide:

$$CuSi_x + NH_{3(plasma)} \rightarrow SiNH_x + Cu + Si$$

and $$Si + NH_3 \rightarrow SiNH_x$$

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus comprising:
    an interconnect including a conductive material extending into a dielectric material layer, wherein an oxidizable material is doped into the interconnect;
    a capping layer to cap a first portion of a surface of the interconnect; and
    a sealing structure adapted to seal a second portion of the surface including at least one gap of exposed interconnect conductive material between the capping layer and the dielectric layer by oxidizing a portion of the oxidizable material adjacent the at least one gap, wherein the second portion of the surface including at least gap of exposed interconnect conductive material is not capped by the capping layer.

2. The apparatus of claim 1, wherein the oxidizable material is annealed to promote diffusion into the interconnect prior to oxidizing the oxidizable material.

3. The apparatus of claim 1, wherein doping the oxidizable material comprises doping an aluminum-containing material into the interconnect.

4. The apparatus of claim 1, wherein doping said oxidizable material comprises doping a tin-containing material into the interconnect.

5. The apparatus of claim 1, wherein the sealing structure comprises an oxide layer formed in said interconnect proximate at least one gap exposing said interconnect.

6. The apparatus of claim 5, wherein said oxide layer comprises an aluminum oxide layer.

7. The apparatus of claim 5, wherein the oxide layer comprises a tin oxide layer.

8. The apparatus of claim 5, wherein the oxide layer comprises a self-passivating oxide layer formed by oxidizing the portion of the oxidizable material adjacent the at least one gap.

9. The apparatus of claim 1, wherein said interconnect including a conductive material comprises an interconnect including a copper-containing conductive material.

10. An apparatus comprising:
    an interconnect including a conductive material extending into a dielectric material layer;
    a barrier layer located between the dielectric material layer and the interconnect conductive material;
    a capping layer to cap a first portion of a surface of the interconnect; and
    a sealing structure adapted to seal at least one gap of exposed interconnect conductive material between the capping layer and the dielectric layer, wherein the sealing structure is formed by doping an oxidizable material into the interconnect prior to the formation of the capping layer and oxidizing a portion of the oxidizable material adjacent the at least one gap after the formation of the capping layer, wherein the portion of the oxidizable material corresponds approximately to a second portion of the surface of the interconnect that is exposed with no capping layer.

11. The apparatus of claim 10, wherein the oxidizable material is annealed to promote diffusion into the interconnect prior to oxidizing the oxidizable material.

12. The apparatus of claim 10, wherein doping the oxidizable material comprises doping an aluminum-containing material into said interconnect.

13. The apparatus of claim 10, wherein doping said oxidizable material comprises doping a tin-containing material into said interconnect.

14. The apparatus of claim 10, wherein the sealing structure comprises an oxide layer formed in said interconnect proximate at least one gap exposing said interconnect.

15. The apparatus of claim 14, wherein said oxide layer comprises an aluminum oxide layer.

16. The apparatus of claim 14, wherein the oxide layer comprises a tin oxide layer.

17. The apparatus of claim 14, wherein the oxide layer comprises a self-passivating oxide layer formed by oxidizing the portion of the oxidizable material adjacent the at least one gap.

18. The apparatus of claim 10, wherein said interconnect including a conductive material comprises an interconnect including a copper-containing conductive material.

* * * * *